United States Patent [19]

Westra

[11] 4,258,315

[45] Mar. 24, 1981

[54] INDUCTANCE METER

[75] Inventor: Marlin D. Westra, Sioux Falls, S. Dak.

[73] Assignee: Sencore, Inc., Sioux Falls, S. Dak.

[21] Appl. No.: 971,880

[22] Filed: Dec. 21, 1978

[51] Int. Cl.³ .................. G01R 11/52; G01R 27/26
[52] U.S. Cl. ........................................................ 324/59
[58] Field of Search .................. 324/59, 60 CD, 60 C, 324/57 R

[56] References Cited

U.S. PATENT DOCUMENTS 3,986,108 10/1976 Thomas ............................ 324/59 X

FOREIGN PATENT DOCUMENTS 1219751 1/1971 United Kingdom ...................... 324/59

Primary Examiner—Stanley T. Krawczewicz
Attorney, Agent, or Firm—Edmond T. Patnaude

[57] ABSTRACT

A direct reading inductance meter applies linearly increasing ramp current pulses to a coil under test and compares the voltage developed across the coil during occurrence of the pulses with the voltage developed across the coil while a steady state current is applied to the coil thereby to provide an output voltage having a value directly related to the inductance of the coil.

6 Claims, 3 Drawing Figures

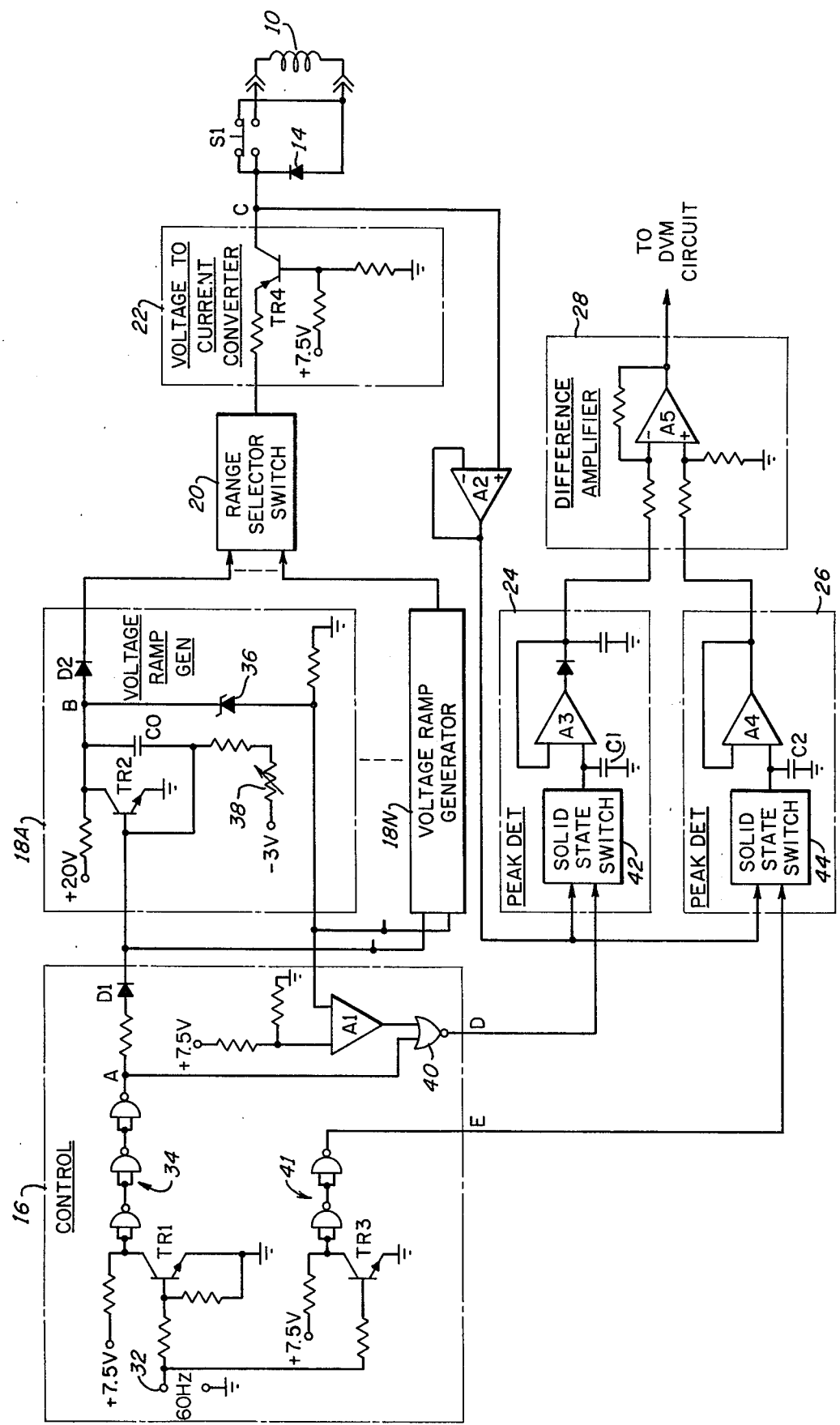

INDUCTANCE METER

The present invention relates in general to the art of inductance measuring, and it relates in particular to a new and improved method and circuit for providing a direct readout of the inductance value of a coil.

BACKGROUND OF THE INVENTION

The method which was heretofor most commonly used to measure the inductance of a coil made use of an impedance bridge wherein several impedance values were adjusted to provide a minimum or null reading on a highly sensitive meter. After balancing the meter the inductance value was then read from a dial associated with one of the adjustable impedances. While such a method is well suited for use in laboratories, it is too time consuming for field use in the servicing of electronic equipment. Moreover, the required bridge components are relatively bulky and expensive, and considerable skill is required to balance the bridge and read the inductance value from the dial.

By definition the inductance value of an inductor is:

$$L(\text{HENRYS}) = \frac{\text{Voltage Across Inductor (VOLTS)}}{di/dt \text{ (amps/seconds)}}$$

It would be desirable to provide a method and circuit for utilizing this basic equation to provide a simple and direct measurement of the inductance of a coil.

SUMMARY OF THE INVENTION

Briefly, in accordance with the broader aspects of the present invention ramp pulses of linearly varying current are applied to a coil under test to develop a peak voltage across the coil during occurrence of the pulses, which peak voltage may be calculated using the following equation:

$$V_p = L\, di/dt + I_{max} R_L$$

wherein:

L is the inductance value of the coil.
$I_{max}$ is the peak current through the coil during each pulse.
$R_L$ is the resistance of the coil.
$di/dt$ is a constant throughout the duration of each pulse.

This peak voltage value, $V_p$, is stored in a capacitor while a steady state current equal to $I_{max}$ is applied to the coil between the ramp pulses. Consequently, between ramp pulses the voltage developed across the coil is as follows:

$$V_s = I_{max} R_L$$

It will be apparent that $$V_p - V_s = L\, di/dt$$

Therefore, for a given constant value of $di/dt$ $$V_p - V_s = KL$$

This difference or output voltage is applied to a voltmeter having its output calibrated directly in Henrys so that the meter automatically provides a direct reading of the inductance value of the coil under test.

In order to facilitate a reading of inductance, it is desirable to employ a meter having a digital readout, and in order to minimize the number of digit readout elements required, there is provided in accordance with another aspect of the invention means for using different values of $di/dt$ for different ranges of inductance value. In this manner a readout of the three most significant digits is provided for a wide overall range of inductance values. In a commercial embodiment of the invention the overall range is from about 0.1 μH to about 10 H.

GENERAL DESCRIPTION OF THE DRAWING

The present invention will be better understood by a reading of the following detailed description taken in connection with the accompanying drawing wherein:

FIG. 3 is a schematic diagram of an inductance measuring circuit constituting a preferred embodiment of the invention.

DETAILED DESCRIPTION OF THE INVENTION

Figure 1:
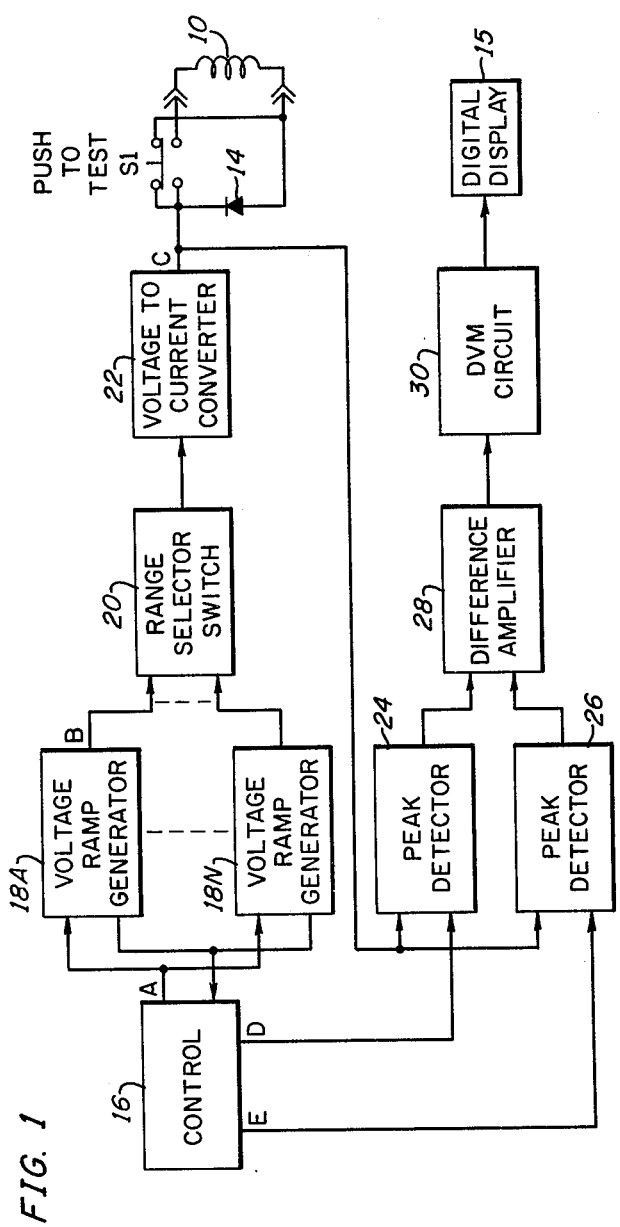
FIG. 1 is a block diagram of an inductance measuring circuit embodying the present invention.

Referring to FIG. 1, a coil or other inductance device 10 whose inductance value is to be measured is connected in series with a spring biased, normally open switch S1 across a diode 14 having its positive terminal connected to ground. When the switch S1 is closed the inductance value of the coil 10 is shown by a digital display 15. In a preferred embodiment of the invention the display has three digits and displays the three most significant digits of a wide range of inductance values.

Figure 2:
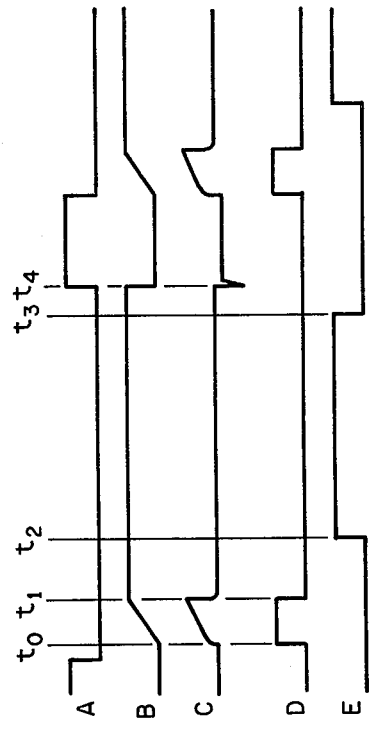
FIG. 2 is a plurality of wave forms useful in understanding the invention.

In accordance with the present invention, a main control circuit 16 of any suitable construction produces a wave form of voltage A as shown in FIG. 2. The wave form A comprises a train of positive rectangular pulses each having a substantially square trailing edge. The wave form A voltage is applied to the inputs of a plurality of voltage ramp generators 18A–18N. Each generator 18 responds to the negative going transition or trailing edge of the wave form A voltage to provide a linearly increasing voltage during a first period of time from $t_0$ to $t_1$ as shown in FIG. 2 and to provide a steady state voltage during a second period of time from $t_1$ to $t_4$. The output wave form of voltage for one of the ramp generators 18 is illustrated as waveform B in FIG. 2. The number of generators 18 which are used will depend on the range of inductance values for which the particular instrument is designed. Each of the generators 18 produces an output waveform having a different slope in the time period between $t_0$ to $t_1$ as is more fully described hereinafter.

A range selector switch 20, which can be operated manually or automatically, connects the waveform B voltage from a selected one of the ramp generators 18 to the input of a voltage to current converter 22 which thus has an output current waveform of the same basic shape as waveform B. The output current from the voltage to current converter 22 is passed through the coil 10 under test to develop across the diode 14 a voltage having a waveform C as shown in FIG. 2. This voltage waveform C is applied to the inputs of a pair of selectively operated peak voltage detectors 24 and 26 having their respective outputs coupled to a difference amplifier 28. The amplifier 28 provides a d.c. output voltage equal to the difference between the two input voltages applied to its inputs and this output voltage is measured by a digital voltmeter circuit 30 which drives the digital readout or display 15.

The peak voltage detector 24 has a d.c. output voltage proportional to the maximum or peak voltage developed across the coil 10 during the period of time from $t_o$ to $t_1$. Hence the control circuit 16 enables the peak detector 24 in synchronism with the negative transition of the waveform A and disables the peak detector 24 at time $t_1$ when the voltage of waveform B reaches its maximum and steady state value. To this end, a control or gating voltage of waveform D as shown in FIG. 2 is applied to the peak detector 24 from the control circuit 16.

The peak detector 26 has a d.c. output voltage proportional to the voltage developed across the coil 10 during the second period from time $t_1$ to time $t_4$ while a steady state d.c. current is passed through the coil 10 under test. Hence the control circuit 16 enables the peak detector 26 during the time period from $t_2$ to $t_3$ as shown in FIG. 2 by applying a control or gating voltage of waveform E to the peak detector 26.

The peak detector and storage devices 24 and 26 store the peak voltages applied thereto for a period greater than the repetition period of the pulses of waveform A wherefor the voltage measured by the digital voltmeter 30 is proportional to the difference in the peak or maximum voltages across the coil 10 during the first and second periods. As explained hereinabove, this difference voltage is proportional to the inductance value of the coil 10 wherefor the digital display 15 displays the inductance value of the coil 10 while the switch 12 is held in the closed position.

As briefly mentioned above, the instrument of the present invention displays on a three digit display the three most significant digits of the measured inductance values within a wide range of values. In accordance with this aspect of the invention a first ramp generator 18A is used when inductance values between 0 $\mu$H and 99.9 $\mu$H are measured, a second ramp generator is used when inductance values between 1 $\mu$H and 999 $\mu$H are measured and so on. It may thus be seen that six ramp generators are required in an instrument for measuring inductance values in the range of 0 to 9.99 H.

In order to facilitate a better understanding of the present invention and of the operation of the inductance measuring instrument of FIG. 1, assume that the coil under test has an inductance of 50 mH and a resistance of 20 ohms. For measuring inductance values in the range of 1 mH to 999 mH the generator 18 whose ramp portion has a slope of 10 volts/millisecond is selected and the ramp portion of the current wave passed through the coil 10 has a slope of 10 ma/m sec. This current has a steady state value between times $t_2$ and $t_3$ of 6 mA.

During the first period between $t_o$ and $t_1$, the peak voltage developed across the coil 10 is therefore:

$$V_P = L\, di/dt + I_{max} R = (.05H)(10\text{ A/sec}) + (.006A)(20\text{ ohms})$$

$$= .620 \text{ volt.}$$

During the second period when the current passed through the coil 10 is constant, di/dt is zero wherefor the voltage developed across the coil 10 is:

$$V_S = L\, di/dt + I_{max} R = (.05)(0) + (.006A)(20\text{ ohms})$$

$$= .120 \text{ volt.}$$

Since the voltage output of the difference amplifier is $$V_D = V_P - V_S$$

$$V_D = 0.620 \text{ volt} - 0.120 \text{ volt} = 0.500 \text{ volt.}$$

The readout or display 15 will thus display the digits 5-0-0. The display is graduated and decimalized to show that the actual inductance value is 50.0 m.h.

If, for example, a coil 10 having an inductance of 525 $\mu$H and a resistance of 2 ohms were to be tested, the ramp generator 18 whose ramp portion has a slope of one amp/msec would be selected. Hence the peak voltage detected during the ramp portion of the applied current would be:

$$V_D = L\, di/dt + I_{max} R - I_{max} R = (0.000525\text{ H})(1000\text{ A/sec}) + (0.006)(2) - (0.006)(2)$$

$$V_R = 0.525 \text{ Volts}$$

The readout 15 will thus display the digits 5-2-5 which is graduated to read 525 $\mu$H or 0.525 mH.

Referring now to FIG. 3 wherein is shown the schematic diagram of an inductance meter embodying several novel features of this invention, the same reference characters as used in FIG. 1 are used to denote the corresponding function blocks in FIG. 3. The ramp voltage generator circuit 18 shown in detail in FIG. 3 is for measuring inductance values in the range of from one to 100 MH and thus provides a ramp portion from $t_o$ to $t_1$ having a slope of 10 amps/sec.

The control circuit 16 is energized from a standard 60 Hz power line and shapes the line frequency power to form the three control signals shown by waveforms A, D and E. The line voltage which is applied between input terminal 32 and ground is coupled by a transistor TR1 to both inputs of a plurality of NAND gates 34 to provide a voltage having the shape of waveform A. This voltage is coupled via a diode D1 to the inputs of the plurality of ramp voltage generators 18.

When the voltage applied to the input of the generator 18 goes low, capacitor Co is permitted to charge from a 20 V power supply bus. The transistor TR2 controls the charging current whereby the voltage across the capacitor Co increases linearly until the voltage at the collector of the transistor TR2 reaches 12 volts and a Zener diode 36 becomes conductive to prevent and further charging of the capacitor Co. The adjustable resistor 38 connected between the capacitor Co and the −3 V power supply terminal is used to calibrate the instrument for each inductance range by adjusting the slope of the voltage across the capacitor Co during charging.

When the Zener diode 36 conducts a positive voltage is applied to the positive input of an amplifier A1 causing its output to go high. The output of the amplifier A1 is applied to one input of a NOR gate 40, the other input having the voltage shown in waveform D applied to it from the control 16. Hence when the Zener diode 38 conducts, the control voltage applied to the peak detector 24 goes low.

The signal which is illustrated in waveform E and which is used to control the peak detector 26 is also derived from the 60 Hz power line voltage by the control circuit 16. As shown, the power line voltage is applied to the base of a transistor TR3 which drives a pair of cascaded NAND gates 41 thereby to provide the positive voltage pulse during the period from $t_2$ to $t_3$.

The waveform B voltage which appears at the collector of the transistor TR2 is transmitted by a diode D2 and the range selector switch 20 to the emitter of the transistor TR4 in the voltage to current converter 22. The collector of the transistor TR4 is connected to the junction between the switch S1 and the diode 14 and also to the positive input terminal of an amplifier A2. The voltage at the output of the amplifier A2 is equal or proportional to the voltage across the coil 10 under test when the switch S1 is closed and this voltage is applied to the input terminals of a pair of solid state switches 42 and 44 respectively provided in the peak voltage detectors 24 and 26. A capacitor C1 is connected between the ground and the output of the switch 42 and a capacitor C2 is connected between ground and the output of the switch 44. Therefore, while the control voltage to the switch 42 from the NOR gate 40 is high, the capacitor C1 charges up to the voltage across the coil 10, and while the control voltage to the switch 44 is high the capacitor C2 charges up to the voltage across the coil 10.

A pair of buffer amplifiers A3 and A4 respectively couple the voltage across the capacitors C1 and C2 to the inputs of the difference amplifier 28 which includes the amplifier A5 whose output is connected to a conventional digital voltmeter circuit which drives the digital readout. The voltage at the output of the amplifier A5 is, as explained hereinabove, proportional to the inductance value of the coil 10 under test, wherefor the three digit number displayed by the digital readout is the inductance value of the coil 10.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. Apparatus for use in measuring the inductance of a coil, comprising
   a source of periodic ramp current pulses,
   each of said pulses having a linearly increasing amplitude throughout a first period,
   means for coupling said pulses to a coil under test,
   means for storing a first voltage corresponding to the maximum voltage developed across said coil only during said first period,
   means for passing a steady state current through said coil during a second period and for storing a second voltage corresponding to the voltage developed across said coil only during said second period,
   the amplitude of said steady state current being equal to the maximum amplitude of said pulses during said first period, and
   means responsive to said first and second voltages for providing a third voltage directly related to the difference between said first and second voltages.

2. Apparatus according to claim 1 comprising
   display means responsive to said third voltage for displaying the inductance value of the coil under test.

3. Apparatus according to claim 2 comprising
   first and second voltage peak detectors respectively including first and second capacitors,
   first switch means for coupling a voltage related to the voltage across said coil to said first capacitor,
   second switch means for coupling a voltage related to the voltage across said coil to said second capacitor, and
   control means for activating only said first switch means during said first period and for activating only said second switch means during said second period.

4. Apparatus according to claim 1, comprising
   a second source of periodic ramp current pulses having a linearly increasing amplitude,
   the ramp current pulses from said second source having a slope greater than the slope of the ramp current pulses from said first source, and
   means for coupling the pulses from said second source to the coil under test in place of the pulses from the first mentioned source of periodic ramp current pulses when the inductance of said coil is less than a predetermined value.

5. A method of measuring the inductance of a coil, comprising the steps of
   passing through said coil during a first period of time a linearly changing current,
   measuring and storing the peak voltage developed across said coil during said first period,
   passing through said coil during a second period of time a steady state current having an amplitude equal to the peak current passed through said coil during said first period,
   measuring and storing the peak voltage developed across said coil during said second period, and
   applying a voltage equal to the difference between said peak voltages to a voltmeter,
   whereby the readout of said voltmeter is directly related to the inductance of said coil.

6. A method according to claim 5 wherein
   the slope of said linearly changing current is made different for respectively different ranges of inductance value for the coils under test, and
   said voltmeter has a digital readout.

* * * * *